United States Patent [19]
Sumi

[11] Patent Number: 6,022,805
[45] Date of Patent: Feb. 8, 2000

[54] METHOD OF FABRICATING SEMICONDUCTOR DEVICE WITH A MULTI-LAYERED INTERCONNECTION STRUCTURE HAVING A LOW CONTACT RESISTANCE

[75] Inventor: Hirofumi Sumi, Kanagawa, Japan

[73] Assignee: Sony Corporation, Japan

[21] Appl. No.: 08/745,619

[22] Filed: Nov. 8, 1996

[30] Foreign Application Priority Data

Nov. 13, 1995 [JP] Japan .................................. 7-294203

[51] Int. Cl.[7] ...................... H01L 21/302; H01L 21/461; C23C 14/00
[52] U.S. Cl. .......................... 438/677; 438/622; 438/635; 438/676; 438/728; 438/710; 438/722; 204/192.32; 204/192.35
[58] Field of Search ..................... 438/622, 635, 438/728, 743, FOR 117, 963, 974, 738, 710, FOR 127, FOR 232, FOR 388, 672, 677, 676, 707; 204/722, 192.32, 192.35

[56] References Cited

U.S. PATENT DOCUMENTS

| | | | |
|---|---|---|---|
| 5,298,446 | 3/1994 | Onishi et al. ........................ | 438/303 |
| 5,403,434 | 4/1995 | Moslehi .............................. | 134/1.2 |
| 5,447,613 | 9/1995 | Ouellet .............................. | 204/192.1 |
| 5,726,097 | 3/1998 | Yamagida ........................... | 438/622 |

*Primary Examiner*—John F. Niebling
*Assistant Examiner*—Ha Tran Nguyen
*Attorney, Agent, or Firm*—Rader, Fishman & Grauer; Ronald P. Kananen

[57] ABSTRACT

A method of fabricating a semiconductor device includes the step of removing native oxide on the surface of a metal silicide layer formed on a shallow impurity diffusion layer and exposed at the bottom portion of a contact hole by sputter etching under an incident ion condition of a high density and a low energy. In this sputter etching, the side surface of the contact hole is prevented from being sputtered and re-deposited on the bottom portion of the contact hole, whereby the native oxide is effectively removed while the impurity diffusion layer is prevented from being damaged. In addition, a substrate may be heated during sputter etching for preventing ion species such as $Ar^+$ from being entrapped in the metal silicide layer.

14 Claims, 5 Drawing Sheets

F I G. 2
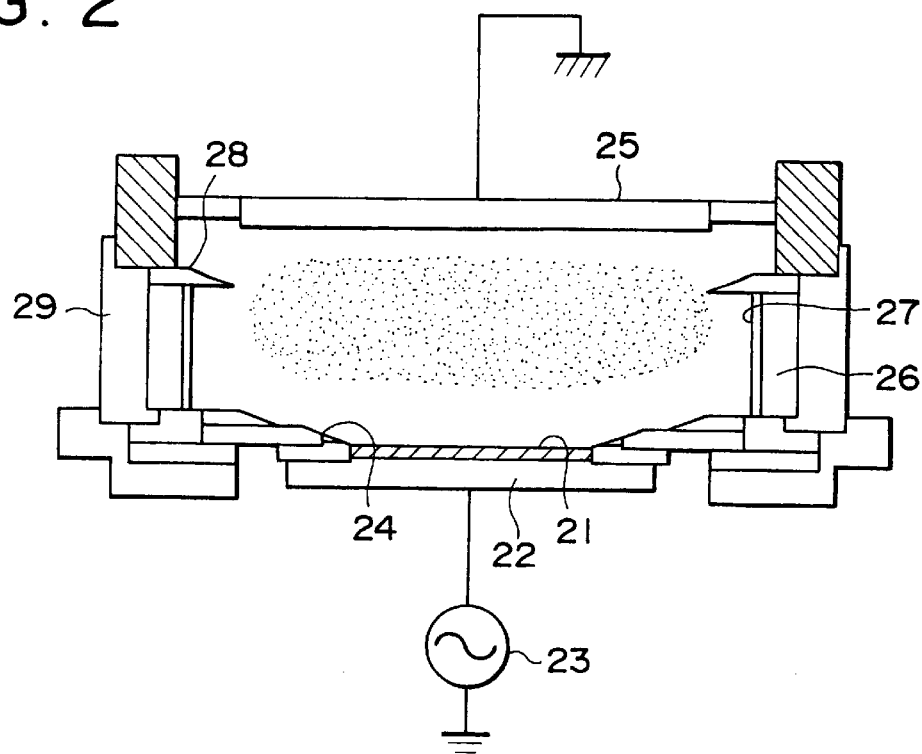
F I G. 3
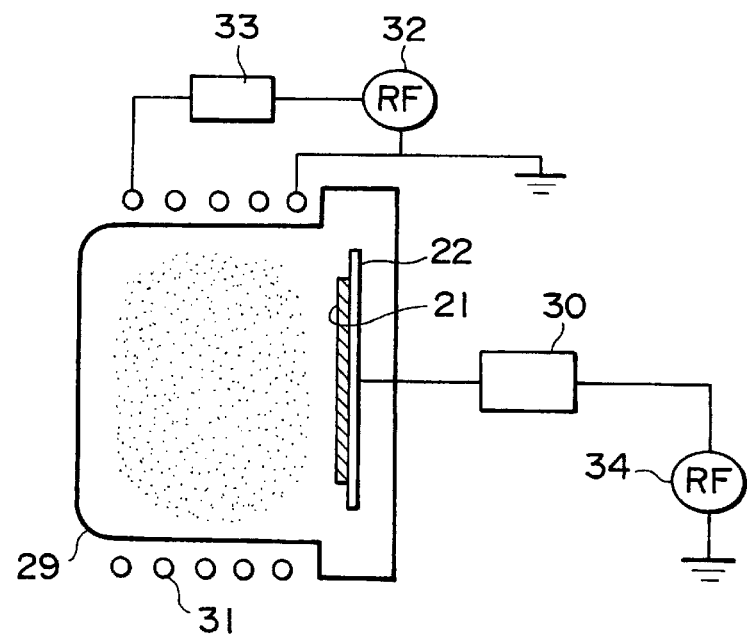

METHOD OF FABRICATING SEMICONDUCTOR DEVICE WITH A MULTI-LAYERED INTERCONNECTION STRUCTURE HAVING A LOW CONTACT RESISTANCE

BACKGROUND OF THE INVENTION

The present invention relates to a method of fabricating a semiconductor device, and particularly to a method of fabricating a highly integrated semiconductor device which includes the steps of forming a contact hole facing a conductive material layer such as a shallow impurity diffusion layer or a metal silicide layer formed on the impurity diffusion layer, and burying the contact hole with a contact plug or an upper layer interconnection, thereby forming a multi-layered interconnection structure having a low contact resistance.

The width of a gate electrode in MIS type transistors is being reduced to be less than a quarter-micron along with the increasing demands toward high integration and high quality of semiconductor devices such as LSIS. In such a fine element structure, in addition to the reduction in the width of a gate electrode, the depth of an impurity diffusion layer is also required to be reduced for lowering a short-channel effect and ensuring a source/drain withstand voltage. For example, for an MIS type transistor having a gate electrode width of 0.25 $\mu$m, the depth of an impurity diffusion layer is required to be made shallow to a value less than about 0.08 $\mu$m (80 nm).

The tendency to make shallow an impurity diffusion layer, however, increases a sheet resistance of a source/drain region, thereby causing another problem in reducing a response speed and an operation limiting frequency of the semiconductor device. This is because an operation limiting frequency "fth" is inversely proportional to a gate delay time "τpd" (fth 1/τpd) in the MIS type transistor. In particular, such a phenomenon presents a large inconvenience in an MPU (Microprocessing Unit) requiring high speed operation.

To cope with such a problem, a Salicide (Self aligned silicide) process has been proposed, wherein a low resistance metal silicide layer made from $TiSi_2$, $CoSi_2$ or the like which is selectively formed on a source/drain region. Now, the Salicide process will be briefly described with reference to FIGS. 5A to 5D.

FIGS. 5A to 5D are schematic sectional views showing a fabrication process of a MOSIC using a common Salicide process. An element isolation region 2 is formed in a semiconducting substrate 1 made from silicon, and a thermal oxide film and a polycrystalline silicon layer are formed on the semiconducting substrate 1, followed by patterning, to form a gate oxide film 3 and a gate electrode 4. Subsequently, ions of an impurity are injected over the entire surface to a shallow depth using the gate electrode 4 as a mask.

An oxide silicon layer is then formed over the entire surface, followed by etching-back over the entire surface, to form side wall spacers 5 on the side surfaces of the gate electrode 4. After that, ions of an impurity are injected again using the gate electrode 4 and the side wall spacers 5 as a mask, followed by activation through heat treatment, to form an impurity diffusion layer 6 having an LDD structure shown in FIG. 5A.

As shown in FIG. 5B, a metal layer 7 made from Ti or the like is formed over the entire surface, and it is subjected to a first heat-treatment at about 600° C. As a result, the metal layer 7 on the impurity diffusion layer 6 is selectively converted into TiSix by solid-phase diffusion. The metal layer 7 does not react with the oxide silicon materials forming the element isolation region 2 and the side wall spacers 5 under the first heat-treatment condition. In the case where the metal layer 7 is formed with the surface of the gate electrode 4 made from polycrystalline silicon exposed, TiSix is also formed on the gate electrode 4. If a spacer made from silicon oxide or the like is formed on the gate electrode 4, TiSix is not formed on the gate electrode 4. The compound TiSix formed by the first heat-treatment has a C49 crystal structure, which has a relatively high resistance.

After that, the non-reactive portion of the metal layer 7 on the element isolation region and the like is removed by wet etching using a mixed solution of ammonia and hydrogen peroxide ($NH_3+H_2O_2$), to selectively leave TiSix on the impurity diffusion layer 6 and the like. The compound TiSix on the impurity diffusion layer 6 and the like is converted into $TiSi_2$ by a second heat-treatment at about 800° C., to form a self-aligned metal silicide layer 8. Such a state is shown in FIG. 5C. In this figure, the metal silicide layer 8 is shown to be also formed on the gate electrode 4. The compound $TiSi_2$ formed by the second heat treatment has a C54 crystal structure, which has a resistance (resistivity: about 15 $\mu\Omega$ cm) lower than that of the metal silicide layer having the C49 crystal structure.

The above steps are a main portion of the Salicide process. After that, as shown in FIG. 5D, an interlayer insulating layer 9 is formed in a normal manner and a contact hole 10 facing the impurity diffusion layer 6 is formed in the interlayer insulating film 9. Subsequently, an upper layer interconnection 16 made from Al based metal or W is formed by the so-called metallization step, thus completing a MOSIC (Metal-Oxide-Semiconductor Integrated Circuit).

The MOSIC having the above-described Salicide structure has an advantage that a source/drain resistance thereof is lower than that of a related art MOSIC by about one figure. However, the exposed area of the impurity diffusion layer 6 comes to be finer along with the recent tendency toward finer design rule of the element. If the Salicide process is applied to such a narrow impurity diffusion layer region, the phase-conversion of TiSix from the C49 crystal structure to the C54 crystal structure cannot be smoothly performed. As a result, crystal grains of TiSix having the C49 crystal structure are aggregated during the second heat-treatment at a high temperature, to coarsen the surface of the metal silicide layer, thus making it impossible to reduce a sheet resistance of the metal silicide layer.

The metal silicide layer is also required to be thinned along with the increasing demand to make shallow the impurity diffusion layer. The thinning of the metal silicide layer also acts to accelerate the aggregation of the crystal grains thereof. Accordingly, there is strong demand at present to develop a Salicide process capable of forming a thin metal silicide layer on a narrow impurity diffusion layer region while preventing aggregation of crystal grains of the metal silicide layer and thereby stably obtaining a smooth surface thereof.

The aggregation of crystal grains of a transition metal silicide layer is considered to be due to uneven native oxide inevitably present on the surface of an impurity diffusion layer. The removal of native oxide on the surface of an impurity diffusion layer has been performed by wet processing using a diluted HF solution or sputter etching using $Ar^+$ of a high ion energy. However, for a highly integrated semiconductor device having a shallow impurity diffusion layer, such a removal process is liable to damage the impurity diffusion layer. In view of the foregoing, the present inventor has proposed a stable Salicide process using a low energy plasma etching system in Japanese Patent Laid-open No. Hei 7-69015, in which native oxide is removed with an incident ion energy being controlled.

The above Salicide process can be stably applied to a highly integrated semiconductor device having a shallow impurity diffusion layer.

A multi-layered interconnection structure is obtained by following steps:

an interlayer insulating film is formed carefully on the metal silicide layer; a contact hole facing the metal silicide layer is formed in the interlayer insulating film; and the contact hole is buried with a contact plug or an upper layer interconnection (metallization). In this case, native oxide is formed again on the surface of the metal silicide layer in a period of time from the steps of forming the contact hole and separating a resist mask to the step of metallization. To obtain a low ohmic contact, it is essential to remove the native oxide formed again on the surface of the metal silicide layer. With native oxide formed on the surface of an impurity diffusion layer, it is usually removed by wet processing using diluted HF solution. However, with the native oxide formed on a metal silicide layer such as $TiSi_2$ which is exposed at the bottom portion of a contact hole, a desired etching selectively is not obtained, $TiSi_2$ is etched together with the native oxide. Thus wet processing cannot be used.

Incidentally, there may be considered a method of removing native oxide by $Ar^+$ sputter etching using a parallel plate etching system. However, to perfectly remove native oxide on a thin metal silicide layer formed on an impurity diffusion layer by the parallel plate etching system having a low ion intensity, 1,000 eV or more of energy must be imparted to $Ar^+$. This coarsens the surface of the thin metal silicide layer, and has a large possibility of damaging the shallow impurity diffusion layer. Moreover, when the aspect ratio of the contact hole is as large as 5 or more, the side wall of the contact hole is sputtered by such a strong incident ion energy, and the sputtered component is re-deposited on the bottom portion of the contact hole. Accordingly, the remove of the native oxide does not proceed, failing to reduce a contact resistance. In the above it was described about the semiconductor having the metal silicide layer. Although, the same problem arises in the case where a contact hole facing a shallow impurity diffusion layer is directly formed, followed by metallization.

SUMMARY OF THE INVENTION

An object of the present invention is to provide a method of fabricating a semiconductor device capable of removing native oxide on a conductive material layer such as an impurity diffusion layer or a metal silicide layer exposed at the bottom portion of a contact hole without any damages the metal silicide layer and/or the impurity diffusion layer, and also of preventing re-deposition of sputter products generated from the side wall of the contact hole on the bottom of the contact hole.

Another object of the present invention is to provide a method of fabricating a semiconductor device having a shallow impurity diffusion layer having a depth of 150 nm or less and a thin metal silicide layer formed thereon, which is capable of stably obtaining a multi-layered interconnection structure having a low resistance ohmic contact.

To achieve the above objects, according to a first aspect of the present invention, there is provided a method of fabricating a semiconductor device, including the steps of:

forming an interlayer insulating film on a conductive material layer, and forming a contact hole facing the conductive material layer in the interlayer insulating film;

removing native oxide which is formed on the surface of the conductive material layer and exposed at the bottom portion of the contact hole; and forming either a contact plug or an upper layer interconnection at least in the contact hole;

wherein the native oxide is removed by sputter etching using an incident ion energy having an intensity more than a value allowing the native oxide to be removed by sputter etching and less than a value allowing a side surface of the contact hole to be sputtered and re-deposited on the surface of the conductive material layer exposed at the bottom portion of the contact hole; and either the contact plug or the upper layer interconnection is formed in the contact hole continuously after removal of the native oxide without exposing, to an oxidizing atmosphere, the surface of the conductive material layer exposed at the bottom portion of the contact hole.

The above conductive material layer may be a metal silicide layer made from, for example, CoSix. Moreover, the above incident ion energy intensity is preferably in a range of from 20 eV to 1,000 eV. In addition, examples of ion species used for the above sputter etching may include rare gases such as Ar, He, Ne, Kr and Xc, and relatively inert gases such as $N_2$.

To achieve the above objects, according to a second aspect of the present invention, there is provided a method of fabricating a semiconductor device, including the steps of:

forming an interlayer insulating film on a conductive material layer, and forming a contact hole facing the conductive material layer in the interlayer insulating film;

removing native oxide which is formed on the surface of the conductive material layer and exposed at the bottom portion of the contact hole; and forming either a contact plug or an upper layer interconnection at least in the contact hole;

wherein the native oxide is removed by sputter etching performed at a substrate temperature more than a value allowing sputter ion species to be entrapped in the conductive material layer exposed at the bottom portion of the contact hole; and either the contact plug or the upper layer interconnection is formed in the contact hole continuously after removal of the native oxide without exposing, to an oxidizing atmosphere, the surface of the conductive material layer exposed at the bottom portion of the contact hole.

The above conductive material layer may be a metal silicide layer made from, for example, CoSix. Moreover, the above substrate temperature is preferably in a range of 300° C. or more. The upper limit of the substrate temperature is not particularly restrictive; however, it is naturally restrictive to be less than a value allowing re-diffusion of the impurity in the impurity diffusion layer or a value allowing condensation of the metal silicide layer. In addition, examples of ion species used for the above sputter etching may include rare gases such as Ar, He, Ne, Kr and Xe, and relatively inert gases such as $N_2$.

The above-described aspects of the present invention are very effective when being applied to a semiconductor device having a fine design rule in which the depth of an impurity diffusion layer is in a range of 150 nm or less.

In summary, the present invention makes it possible to uniformly and perfectly remove native oxide on the surface of a shallow impurity diffusion layer or a metal silicide layer formed thereon while preventing the surface of such a conductive material layer from being coarsened and damaged (for example, crystal defects). The present invention can also prevent ion species such as $Ar^+$ from being entrapped in the conductive material layer by combination with heating of a substrate during sputter etching.

The present invention is thus advantageous in forming an interconnection having a low resistance ohmic contact by forming a contact plug and/or an upper layer interconnection on the cleaned surface of the impurity diffusion layer directly after removal of the native oxide, and thereby improving characteristics, such as high speed operation, low voltage operation and low power consumption, of a highly integrated semiconductor device of a fine design rule such as a MOSIC.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIGS. 1A to 1F are schematic sectional views for sequentially illustrating steps of fabricating a MOSIC in Examples 1 to 4 of the present invention, wherein FIG. 1A shows a state in which a gate electrode is formed on an element region of a semiconducting substrate; FIG. 1B shows a state in which side wall spacers and an impurity diffusion layer are formed; FIG. 1C shows a state in which a metal layer is formed over the entire surface; FIG. 1D shows a state in which a metal silicide layer is selectively formed on the impurity diffusion layer and the like by heat-treatment; FIG. 1E shows a state in which an interlayer insulating film is formed and then a contact hole facing the metal silicide layer is formed; and FIG. 1F shows a state in which native oxide on the surface of the metal silicide layer is removed and a contact plug and an upper layer interconnection are formed;

FIG. 2 is a schematic sectional view showing a configuration of a magnetron RIE system used in Examples 1, 2;

FIG. 3 is a schematic sectional view showing a configuration of an ICP etching system used in Examples 3, 4;

FIGS. 5A to 5D are schematic sectional views for sequentially illustrating general steps for fabricating a MOSIC using a Salicide process; wherein FIG. 5A shows a state in which a gate electrode and an impurity diffusion layer are formed on an element region of a semiconducting substrate; FIG. 5B shows a state in which a metal layer is formed over the entire surface; FIG. 5C shows a state in which a metal silicide layer is selectively formed on the impurity diffusion layer by heat-treatment; and FIG. 5D shows a state in which a contact hole is formed in an interlayer insulating film and an upper layer interconnection is formed.

DETAILED DESCRIPTION OF PREFERRED EMBODIMENTS

First, the function of the present invention will be described below.

Figure 4:
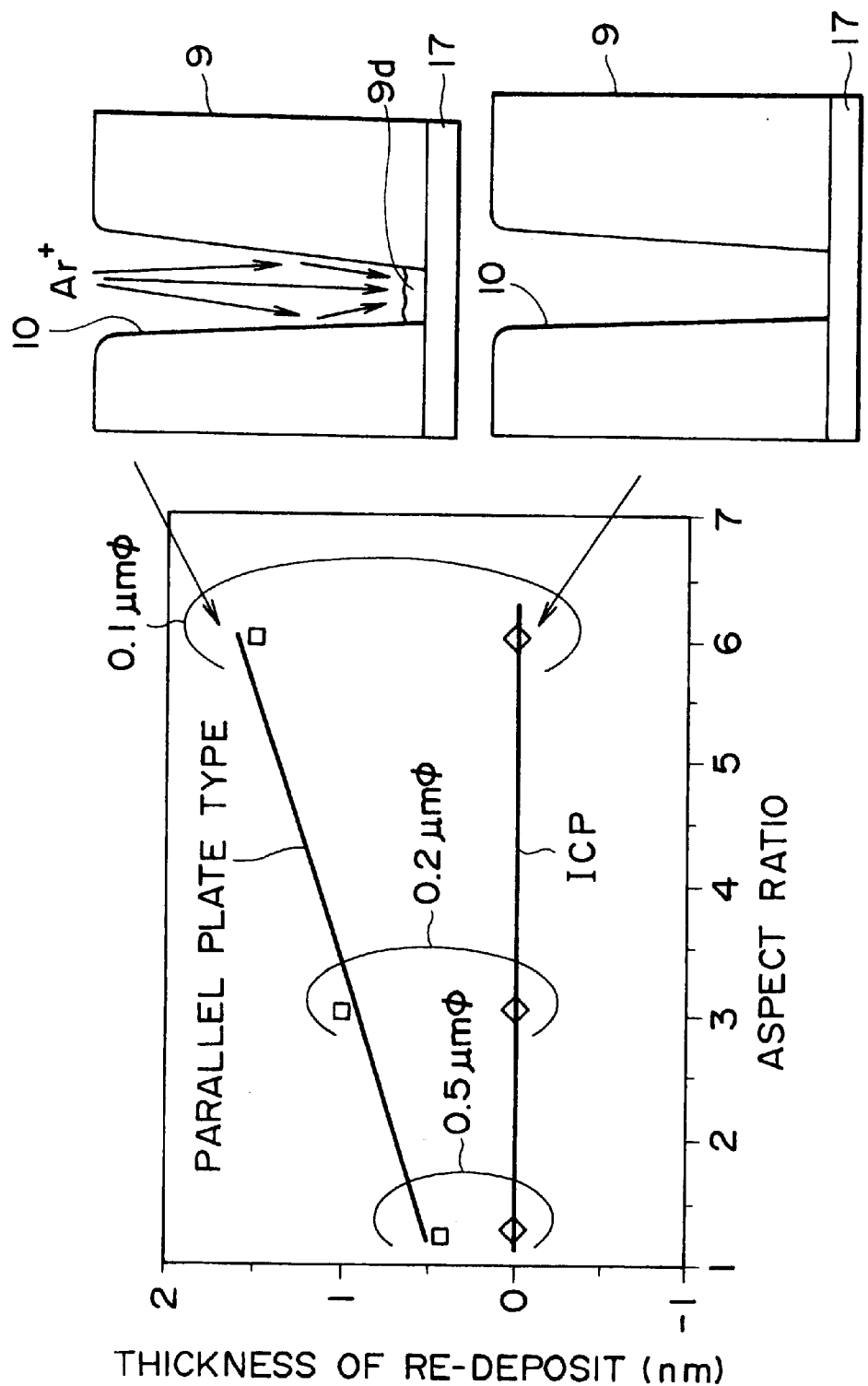
FIG. 4 is a diagram showing a state in which products formed by sputtering of the side surface of a contact hole are re-deposited upon sputter etching of native oxide on the surface of the conductive material layer exposed at the bottom portion of the contact hole.
Figure 5A:
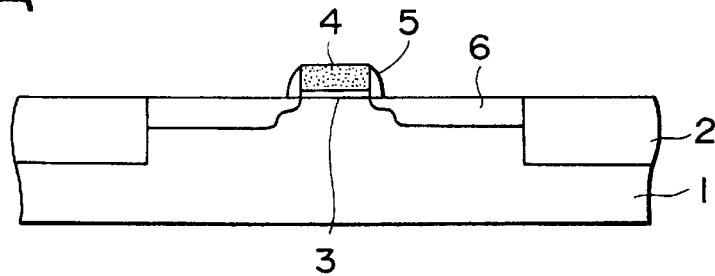
Figure 5B:
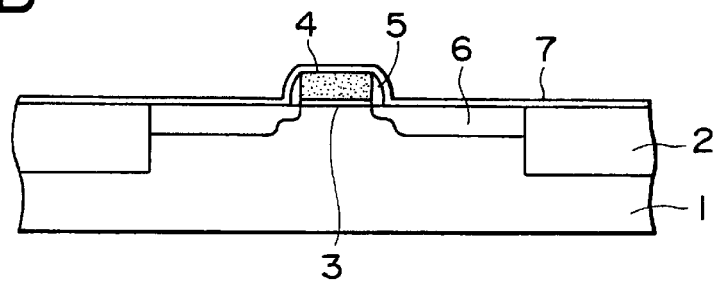
Figure 5C:
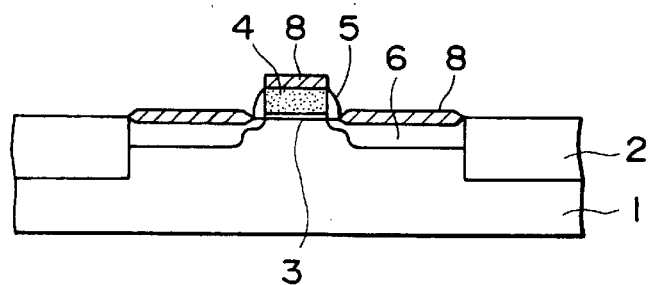
Figure 5D:
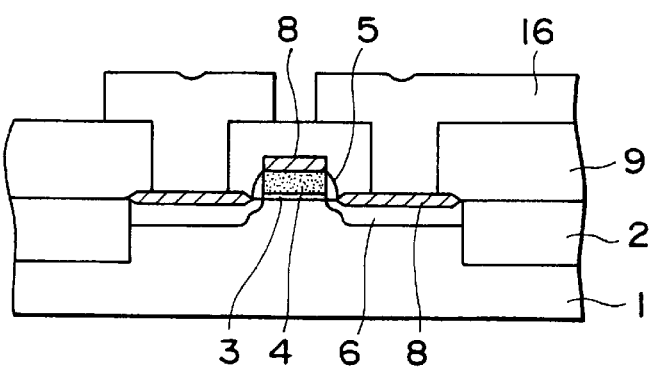

The present inventor has examined removal of native oxide on the surface of a conductive material layer exposed at the bottom portion of a contact hole, and found the fact that a low resistance ohmic contact can be formed only in the case where an incident ion energy intensity is specified in a suitable range, and that the suitable range of the incident ion energy intensity is closely related to an aspect ratio of the contact hole. Such a relationship is shown in FIG. 4.

When native oxide on the surface of a conductive material layer 14 in the bottom portion of each of contact holes having various opening diameters and aspect ratios is removed by sputter etching using $Ar^+$, the side wall of the contact hole is undesirably sputtered and the sputter products are re-deposited on the bottom portion of the contact hole. FIG. 4 shows a state of the undesirable sputter etching of the side wall of the contact hole and the re-deposition of the sputter products thus sputtered on the bottom portion of the contact hole and the thickness thereof. In addition, the sputter etching systems used in this test are a parallel plate etching system capable of processing a sample at an incident energy intensity more than about 1,000 eV, and an ICP (Inductively Coupled Plasma) etching system capable of processing a sample at an incident ion energy intensity of about 100 eV.

In the parallel plate etching system, an applied voltage must be set to be more than a threshold value for generating a stable plasma between diode electrodes, and accordingly, the incident ion energy intensity inevitably exceeds about 1,000 eV; however, the ion density is as low as the order of about $10^9/cm^3$.

On the other hand, in the etching system having a high density plasma generating source such as the ICP etching system, an ECR (Electron Cyclotron Resonance) plasma etching system, or a helicon wave plasma etching system, a power for generating a plasma can be selected independently from a substrate bias power, thereby enabling a low damage etching at a high throughput by the use of a weak incident energy and a high density plasma in the order of $10^{11-1012}/cm^3$.

A magnetron type parallel plate etching system using a magnetic field, which has characteristics intermediate between those of the above parallel plate etching system and the etching system having a high density plasma generating source, makes it possible to reduce an applied power with the aid of a magnetron discharge and hence to process a sample at a plasma density in the order of $10^{10}/cm^3$.

As can be seen from the schematic sectional view of a contact hole 10 shown in FIG. 4, in the sputter etching by the parallel plate etching system, the side wall of the contact hole 10 is sputtered by a strong incident ion energy and the sputtered products are deposited as an insulative re-deposit 9d on the surface of a conductive material layer 14 exposed at the bottom portion of the contact hole 10. The re-deposited 9d is partially removed by $Ar^+$ directly incident to the bottom portion of the contact hole 10. However, in the case where the opening diameter of the contact hole 10 is minute and the aspect ratio thereof is large, the re-deposition is predominant, and thereby the thickness of the re-deposit 9d increases. The thickness of the re-deposit 9d increases as the opening diameter of the contact hole 10 is made smaller and the aspect ratio of the contact hole 10 is made larger as described above. Consequently, the contact hole having a minute opening diameter and a high aspect ratio cannot be sputter-cleaned by the parallel plate etching system having an incident ion energy of about 1,000 ev or more, thereby making it difficult to obtain a low resistance ohmic contact.

In addition, in the schematic sectional view of the contact hole 10 shown in FIG. 4, the thickness of an interlayer insulating film 9 is 0.6 μm and the opening diameter of the contact hole 10 is 0.1 μm.

On the contrary, in the ICP etching system enabling sputter etching at an incident ion energy of about 100 eV, the side wall of the contact hole 10 is not sputtered because of a small incident angle of ions to the side wall of the contact hole 10 resulting from a high vacuum and high uniform plasma, in addition to the small incident ion energy, and consequently, the re-deposit 9d is never formed on the surface of the conductive material layer 14 exposed at the bottom portion of the contact hole 10. Moreover, in this case, $Ar^+$ incident to the bottom portion of the contact hole 10 has a high density enough to remove the native oxide on the surface of the conductive material layer 14 without any damages thereto, thereby enabling effective sputter cleaning. The substrate thus processed is continuously subjected to metallization without exposure to an oxidizing atmosphere, to easily obtain a low resistance ohmic contact.

The incident ion energy required for remove native oxide on the surface of a metal silicide layer may be set to be more than about 20 eV, preferably, to be more than about 50 eV for a practical etching rate. Such an incident ion energy can be freely controlled by setting a substrate bias power of a high density plasma etching system.

The method of fabricating a semiconductor device according to the present invention is also characterized in that native oxide on the surface of a conductive material layer is removed with a substrate controlled to be heated at a high temperature for preventing incident $Ar^+$ from being entrapped in the metal silicide layer. The heating of the substrate increases lattice vibrating energy of crystals of the conductive material layer, allowing Ar atoms to receive the vibration energy. This makes easy separation of $Ar^+$ from the surface of the conductive material layer, cleaning the surface of the conductive -material layer, thereby contributing to formation of a low resistance ohmic contact. The above effect can be obtained, on the principle, by heating the substrate at a temperature more than room temperature; however, the effect is increased at a substrate temperature more than 200° C., preferably more than 300° C. The inventive feature of heating the substrate in sputter etching may be performed independently or in combination of the previous inventive feature of using a low incident ion energy in sputter etching.

The present invention particularly exhibits a large effect when being applied to a fabricating process for a highly integrated semiconductor device (design rule: 0.35–0.5 μm) including a shallow impurity diffusion layer having a depth of about 150 nm or less.

The present invention will be more apparent with reference to examples shown in the drawings. In these figures, parts corresponding to those shown in FIGS. 5A to 5D used for description of the related art are indicated by the same reference numerals.

EXAMPLE 1

This example will be described with reference to FIGS. 1A to 1F and FIG. 2, in which the surface of a metal silicide layer on an impurity diffusion layer exposed at the bottom portion of a contact hole is subjected to soft etching by a magnetron RIE (Reactive Ion Etching) system for removing native oxide formed thereon, followed by continuous metallization.

FIG. 2 is a schematic sectional view showing a configuration of the magnetron RIE system used in this example. A substrate 21 to be processed is placed on a substrate stage 22 serving as a lower electrode connected to a RF power supply 23, and is held by a clamper 24 made from ceramics. A gas shower head 25 serving as an upper electrode is provided on the upper portion of a chamber 29 at a position opposed to the substrate 21, which is connected to the ground. A magnet 26 covered in its exposed surface with a quartz liner 27, which is disposed on the side surface of the chamber 29, acts to improve the density of plasma in the chamber 29 by drift motion of electrons due to lines of magnetic force. Reference numeral 28 indicates a shield plate for preventing sputtering of the gas shower head 25 serving as the upper electrode. In FIG. 2, details of a gas inlet, vacuum pump, a carrier for carrying the substrate, and the like are omitted. The magnetron RIE system in this example is, while being not shown, configured as a cluster tool in which the substrate can be carried by way of gate valves to other processing chambers of a sputtering system for metallization and a CVD (Chemical Vapor Deposition) system without exposure of the substrate to atmospheric air.

The magnetron RIE system in this example makes it possible to effect sputter etching for a substrate by ions having a relatively high density in the order of $10^{10}/cm^3$, and to subsequently effect metallization for the substrate without oxidation of the surface of the substrate.

Next, a method of fabricating a semiconductor device according to the present invention will be described with reference to FIGS. 1A to 1F, in which native oxide on the surface of a metal silicide layer made from CoSix is removed.

First, a MOS transistor is prepared in accordance with a normal process.

Figure 1A:
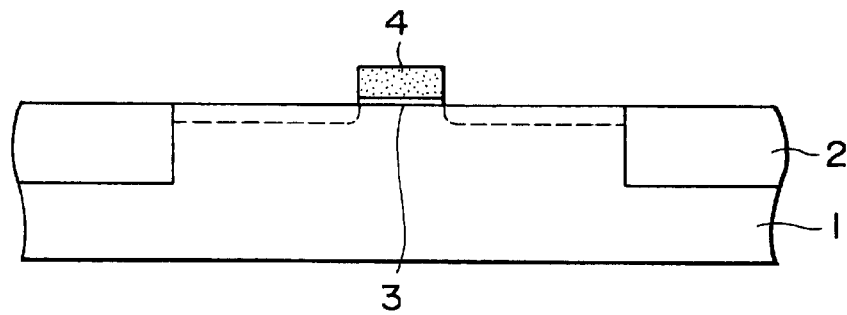

As shown in FIG. 1A, an element isolation region 2 is formed in a semiconducting substrate 1 made from silicon by a LOCOS (Local Oxidation of Silicon) method or a trench isolation method. An exposed element region of the semiconducting substrate 1 is thermally oxidized, and an $n^+$-polycrystalline silicon layer is formed, followed by patterning, to form a gate oxide film 3 and a gate electrode 4. Ions of an impurity are lightly injected in the element region with the gate electrode 4 used as a mask.

Figure 1B:
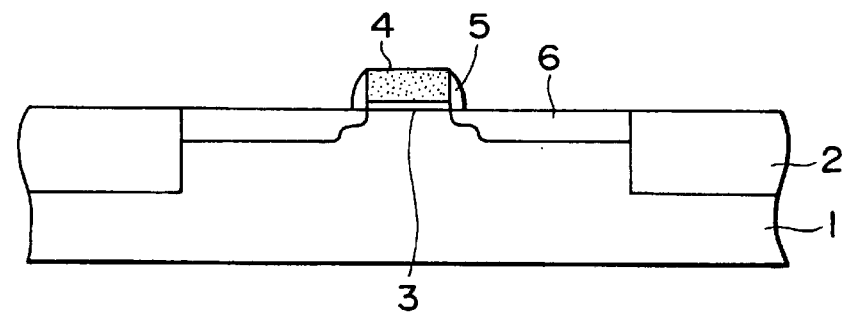

As shown in FIG. 1B, a silicon oxide film is deposited thick over the entire surface, followed by etching-back over the surface, to form side wall spacers 5 on the side surfaces of the gate electrode 4. After that, ions are injected again with the gate electrode 4 and the side wall spacers 5 used as a mask, followed by activation by heat-treatment, to form an impurity diffusion layer 6 having an LDD (Lightly Doped Drain) structure.

Figure 1C:
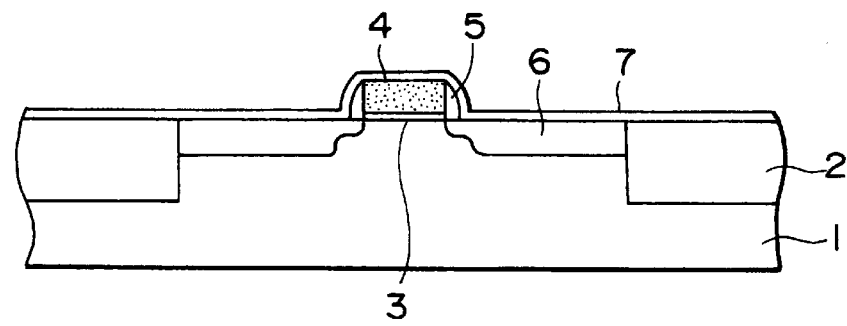

As shown in FIG. 1C, after removal of native oxide (not shown) from the surface of the impurity diffusion layer 6 without any damages thereto, Co is deposited on the entire surface by RF sputtering or the like, to form a metal layer 7 to a thin thickness.

The formation condition of the Co film is as follows:
flow rate of Ar: 100 sccm
sputtering pressure: 0.47 Pa
RF power: 1 KW (13.56 MHz)
substrate temperature: 150° C.
film thickness: 30 nm The removal of the native oxide on the surface of the impurity diffusion layer 6 can be performed by normal wet processing using a diluted HF solution; however, it is preferably performed by soft etching using a high density plasma etching system previously proposed by the present inventor in Japanese Patent Application No. Hei 7-69015, which is capable of preventing the surface of the impurity diffusion layer 6 from being coarsened or damaged due to crystal defects. Even in this case, it is desirable to use a continuously processing system in which the etching system is connected to the RF sputtering system and the like through gate valves for preventing the substrate from being exposed to atmospheric air.

The substrate is then subjected to a first heat-treatment by RTA (Rapid Thermal Anneal) in a $N_2$ atmosphere, to convert the metal layer 7 on the impurity diffusion layer 6 and the gate electrode 4 into CoSix.

The condition of the first heat-treatment by RTA is as follows:

flow rate of $N_2$: 5,000 sccm substrate temperature: 550° C.

processing time: 30 sec

The substrate is dipped in a mixed solution of ammonia and hydrogen peroxide, to remove the non-reactive portion of the metal layer 7. Subsequently, the substrate is subjected to a second heat-treatment, to form a metal silicide layer 8 made from stable $CoSi_2$.

The condition of the second heat-treatment is as follows:

flow rate of $N_2$: 5,000 sccm substrate temperature: 800° C.

processing time: 30 sec

Figure 1D:
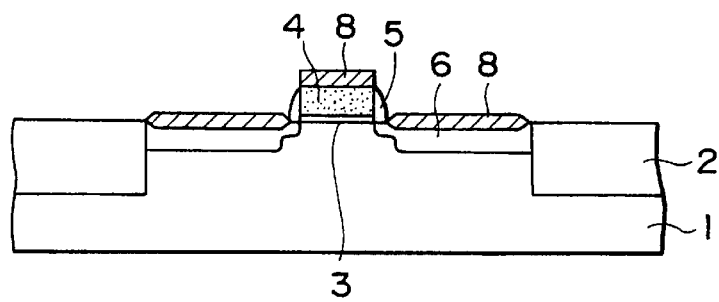

Such a state is shown in FIG. 1D. In this figure, the metal silicide layer 8 is also formed on the gate electrode 4.

After that, an interlayer insulating film 9 made from $SiO_2$ is formed by low pressure CVD using TEOS (Tetra Ethyl ortho Silicate) in the following condition.

| | |
|---|---|
| flow rate of TEOS: | 50 sccm |
| $O_2$: | 50 sccm |
| gas pressure: | 40 Pa |
| substrate temperature: | 720° C. |
| thickness of interlayer insulating film: | 600 nm |

A resist mask (not shown) having an opening portion facing the metal silicide layer 8 on the impurity diffusion layer 6 is formed, and a contact hole 10 is formed by RIE in the following condition.

flow rate of $C_4F_8$: 50 sccm gas pressure: 2 Pa

RF power: 1200 W

Such a state is shown in FIG. 1D. Although the above RIE condition is the same as that commonly used, the RIE must be carefully performed in such a manner as not to damage the metal silicide layer 8. Namely, the etching is preferably performed at an incident ion energy specified so as to cut the chemical bonding of the material of the interlayer insulating layer 9 but to keep the chemical bonding of the metal silicide layer 8. Such a plasma etching is preferably performed using a method previously proposed by the present inventor in Japanese Patent Application No. Hei 7-252637. Then, the resist mask is removed, to obtain a state shown in FIG. 1E.

The subsequent step constitutes a main feature of this example.

Figure 1E:
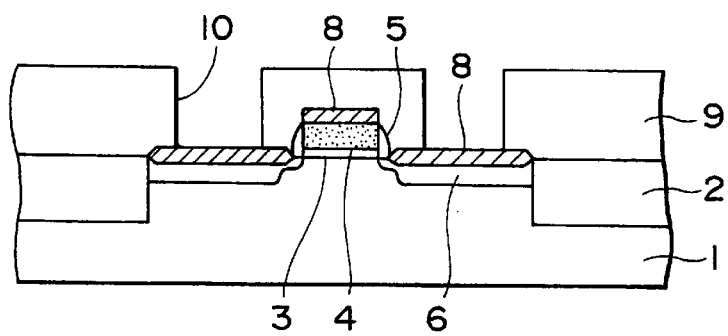

Since native oxide (not shown) is non-uniformly formed on the surface of the metal silicide layer 8 exposed at the bottom portion of the contact hole 10, a low resistance ohmic contact cannot be obtained by metallization unless such native oxide is removed. For this reason, the substrate shown in FIG. 1E is placed on the substrate stage 22 of the magnetron RIE system shown in FIG. 2, and the native oxide is removed by sputter etching for about one minute under the following condition.

flow rate of Ar: 20 sccm gas pressure: 0.4 Pa

RF power: 500 W magnetic field strength: $5 \times 10^{-3}$ T (50 G)

substrate temperature: normal temperature

The sputter etching in this example is performed using the RF power lower than that used for a normal RIE without use of any magnetic field. Accordingly, an ion energy incident to the substrate 21 is due to a relatively low self-bias, so that the side surface of the contact hole 10 is not sputtered and hence re-deposited products are not formed on the surface of the metal silicide layer 8. On the other hand, since the ion density is as high as the order of $10^{10}/cm^3$ and thereby the amount of $Ar^+$ incident to the bottom portion of the contact hole 10 is large, the native oxide on the surface of the metal silicide layer 8 can be removed without any damages thereto.

Subsequently, the substrate thus processed is carried to the sputtering system without exposure to atmospheric air. In the sputtering system, an adhesive/barrier metal layer 11 having a Ti/TiN stacked structure is formed in a conformal manner by sputtering and reactive sputtering.

(1) Formation Condition of Ti Layer:

flow rate of Ar: 100 sccm gas pressure: 0.47 Pa

RF power: 8 KW substrate temperature: 150° C.

film thickness: 10 nm (2) Formation Condition of TiN Layer:

| | |
|---|---|
| flow rate of Ar: | 40 sccm |
| $N_2$: | 20 sccm |
| gas pressure: | 0.47 Pa |
| RF power: | 5 KW |
| substrate temperature: | 150° C. |
| film thickness: | 70 nm |

Next, a high melting point metal layer 12 made from W is formed by blancket CVD (Chemical Vapor Deposition) under the following condition.

| | |
|---|---|
| flow rate of $WF_6$: | 75 sccm |
| $H_2$: | 500 sccm |
| $N_2$: | 300 sccm |
| Ar: | 2,200 sccm |
| gas pressure: | $1.1 \times 10^4$ Pa |
| substrate temperature: | 450° C. |
| film thickness: | 400 nm |

After that, the adhesive/barrier metal layer 11 and the high melting point metal layer 12 positioned over the surface of the interlayer insulating film 9 are etched-back over the entire surface under the following RIE condition, to form a contact plug 13.

flow rate of $SF_6$: 50 sccm gas pressure: 1.33 Pa

RF power: 150 W

Next, a stacked structure of a barrier layer 14 made from Ti and an Al based metal layer 15 is formed by sputtering.

(1) Formation Condition of Barrier Layer:
flow rate of Ar: 100 sccm
gas pressure: 0.47 Pa
RF power: 4 KW
substrate temperature: 150° C.
film thickness: 30 nm (2) Formation Condition of Al Based Metal Layer (Al—1%Si—0.5%Cu):
flow rate of Ar: 50 sccm
gas pressure: 0.47 Pa
RF power: 22.5 KW
substrate temperature: 150° C.
film thickness: 500 nm After that, a resist mask (not shown) having a shape corresponding to a desired interconnection shape is formed, and an upper layer interconnection layer 16 having a stacked structure of a barrier layer 14 and an Al based metal layer 15 is formed by an ECR plasma etching system of a substrate bias applying type under the following condition.

| | |
|---|---|
| flow rate of $BCL_3$: | 60 sccm |
| $Cl_2$: | 90 sccm |
| gas pressure: | 0.16 Pa |
| microwave power: | 1 KW |
| RF power: | 50 W |

Figure 1F:
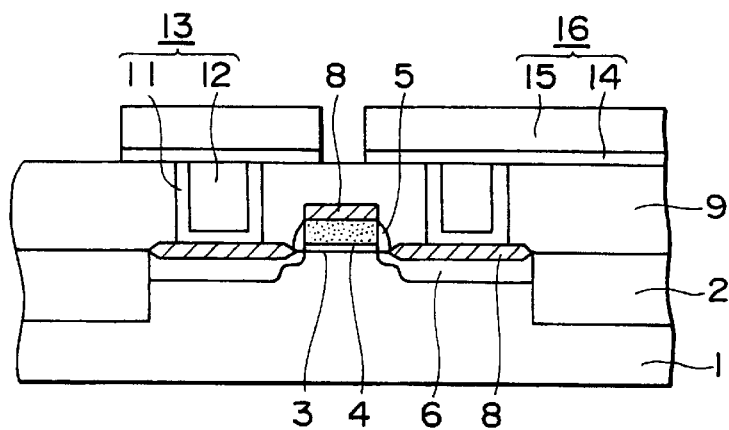

The processing steps are completed, and an MOSIC is obtained. Such a state is shown in FIG. 1F.

This example, in which the native oxide on the metal silicide layer is removed by the magnetron RIE system under the relatively higher density and low incident ion energy condition, is advantageous in forming a semiconductor device of a multi-layered interconnection structure having a low resistance ohmic contact.

EXAMPLE 2

This example has a basic configuration similar to that of Example 1, except for the removal condition for native oxide on the metal silicide layer. In this example, the flow rate of Ar is reduced and the difficulty in starting and holding of a stable plasma discharge due to reduction in flow rate of Ar is solved by the use of a large sized magnet. One sputter-etching condition is as follows:

flow rate of Ar: 2 sccm
gas pressure: 0.04 Pa
RF power: 500 W
magnetic field strength: $10 \times 10^{-3}$ T (100 G)
substrate temperature: normal temperature In this sputter etching condition, the gas pressure can be reduced by the use of the magnet having a high magnetic fields, and thereby a vertical incident component can be ensured while the total incident amount of $Ar^+$ to the substrate is reduced. As a result, the sputtering of the side surface of the contact hole 10 by the obliquely incident ion component can be nearly perfectly avoided, and accordingly, any re-deposit is not formed on the surface of the metal silicide layer 8. On the other hand, the native oxide on the surface of the metal silicide layer 8 can be removed without any damages thereto. The subsequent steps are the same as those in Example 1, and therefore, they are not repeatedly described.

EXAMPLE 3

In this example, an ICP etching system is used for the sputter-etching for removing native oxide on a metal silicide layer. A configuration of the ICP etching system will be described with reference to FIG. 3.

FIG. 3 is a schematic sectional view of a configuration of the ICP etching system. A substrate 21 to be processed is placed on a substrate stage 22 in a chamber 29 made from a dielectric material such as quartz, and a substrate bias is applied from a substrate bias power supply 34 through a matching impedance 30. On the other hand, a large diameter ICP coil 31 wound around the side surface of the chamber 29 is connected to an ICP power supply 32 through a different matching impedance 33. In addition, the substrate stage 22 contains a substrate heating means (not shown) such as heater. Even in the ICP etching system, details of a gas inlet, vacuum pump, clamper for the substrate 21, and the like are not shown in FIG. 4. The ICP etching system in this example is, while being not shown, configurated as a cluster tool capable of carrying the substrate to a sputtering system for metallization and a CVD system by way of gate valves without exposure of the substrate to atmospheric air.

The ICP etching system having the above configuration enables uniform etching not affected by a dispersed magnetic field because it does not require any magnetic field. In addition, the use of the large diameter ICP coil 31 enables etching in the chamber 29 by a high density plasma in the order of $10^{12}/cm^3$.

Next, a method of fabricating a semiconductor device in this example will be described.

This example has basic processing steps similar to those in Example 1, except for the removal condition for native oxide on the metal silicide layer. The sputter-etching for removal of native oxide is as follows. The substrate shown in FIG. 1E (Example 1) is placed on the substrate stage 22 of the ICP etching system shown in FIG. 3, and native oxide (not shown) on the metal silicide layer 8 is subjected to sputter etching under the following condition.

flow rate of Ar: 2 sccm
gas pressure: 0.04 Pa
ICP power: 600 W (450 kHz)
substrate bias power: 50 W (13.56 MHz)
substrate temperature: normal temperature The above sputter etching condition enables sputter etching at a low incident ion energy of about 70 eV and at a high density plasma because the substrate bias power is set at a low value. Accordingly, the sputtering of the side surface of the contact hole 10 is effectively avoided, that is, any re-deposit is not formed on the surface of the metal silicide layer 8. On the other hand, native oxide on the surface of the metal silicide layer 8 is removed without any damages thereto. The subsequent steps are the same as those in Example 1, and therefore, they are not repeatedly described.

EXAMPLE 4

This example is modified from Example 3 in that the substrate is heated in the main step of removing native oxide on the metal silicide layer.

One sputter etching condition is shown as follows:

flow rate of Ar: 2 sccm
gas pressure: 0.04 Pa
ICP power: 600 W (450 kHz)
RF power: 50 W (13.56 MHz)
substrate temperature: 400° C.

The subsequent steps are the same as those in the previous examples.

The above sputter etching condition enables sputter etching at a low incident ion energy of about 70 eV and at a high density plasma because the RF power is set at a low value. Accordingly, the sputtering of the side surface of the contact hole 10 is effectively avoided, that is, any re-deposit is not formed on the surface of the metal silicide layer 8. On the other hand, native oxide on the surface of the metal silicide layer 8 is removed without any damages thereto. Moreover, by setting the substrate temperature at a high value, it is possible to make smaller the amount of $Ar^+$ entrapped in the metal silicide layer 8 and hence to form a low resistance ohmic contact.

While the four examples of the present invention have been described using specific terms, such description is for illustrative purposes only, and it is to be understood that changes and variations may be made without departing from the spirit or scope of the present invention.

For example, although the examples have been described for the metal silicide layer made from CoSix, the present invention can be applied to metal silicide layers made from other metals such as Ti, Ni, W, Mo, Pt, Zr, and Hf. In particular, for the metal silicide layer made from $TiSi_2$, not only native oxide but also $TiSi_2$ itself are removed by a HF solution as described above, and consequently, only native oxide on the surface of the metal silicide layer made from $TiSi_2$ cannot be removed by wet etching. Accordingly, the present invention exhibits a large effect for the metal silicide layer made from $TiSi_2$.

Although a metal silicide layer formed on the impurity diffusion layer is exemplified as a conductive material layer in the examples, the present invention may be applied to removal of native oxide formed on the impurity diffusion layer itself, and particularly, the present invention is suitably applied to purification of the surface of an impurity diffusion layer of a highly integrated semiconductor device having shallow junctions.

The present invention may be of course applied to removal of native oxide on the surface of an interconnection layer (made from polycrystalline silicon and polycide of a fine design rule) exposed at the bottom portion of a contact hole facing the interconnection layer.

In the examples, the contact hole is buried with a contact plug and an upper interconnection is formed thereon; however, the contact hole is buried with part of the upper interconnection by sputtering an Al based metal at a high temperature.

Although an MOSIC is exemplified as a semiconductor device in the examples, the present invention may be applied to various electronic devices such as a bipolar IC, BiMOS-IC, CCD system and superconducting element. In addition, the etching system and the processing condition can be variously changed without the technical thought of the present invention.

What is claimed is:

1. A method of fabricating a semiconductor device, comprising the steps of:

forming an interlayer insulating film on a conductive material layer, and forming a contact hole facing said conductive material layer in said interlayer insulating film;

removing native oxide which is formed on the surface of said conductive material layer and exposed at the bottom portion of said contact hole; and forming either a contact plug or an upper layer interconnection at least in said contact hole;

wherein said native oxide is removed by sputter etching using an incident ion energy having an intensity more than a value allowing said native oxide to be removed by sputter etching and less than a value allowing a side surface of said contact hole to be sputtered and re-deposited on the surface of said conductive material layer exposed at the bottom portion of said contact hole; and either said contact plug or said upper layer interconnection is formed in said contact hole continuously after removal of said native oxide without exposing, to an oxidizing atmosphere, the surface of said conductive material layer exposed at the bottom portion of said contact hole.

2. A method of fabricating a semiconductor device according to claim 1, wherein the incident ion energy intensity is in a range of from 20 eV to 1,000 eV.

3. A method of fabricating a semiconductor device according to claim 1, wherein said conductive material layer is an impurity diffusion layer formed on a semiconducting substrate.

4. A method of fabricating a semiconductor device according to claim 3, wherein the depth of said impurity diffusion layer is in a range of 150 nm or less.

5. A method of fabricating a semiconductor device according to claim 1, wherein said conductive material layer is a metal silicide layer formed on the surface of an impurity diffusion layer formed on a semiconducting substrate.

6. A method of fabricating a semiconductor device according to claim 5, said metal silicide layer is made from CoSix.

7. A method of fabricating a semiconductor device according to claim 5, wherein the depth of said impurity diffusion layer is in a range of 150 nm or less.

8. A method of fabricating a semiconductor device, comprising the steps of:

forming an interlayer insulating film on a conductive material layer, and forming a contact hole facing said conductive material layer in said interlayer insulating film;

removing native oxide which is formed on the surface of said conductive material layer and exposed at the bottom portion of said contact hole; and forming either a contact plug or an upper layer interconnection at least in said contact hole;

wherein said native oxide is removed by sputter etching performed at a substrate temperature more than a value allowing sputter ion species to be entrapped in said conductive material layer exposed at the bottom portion of said contact hole; and either said contact plug or said upper layer interconnection is formed in said contact hole continuously after removal of said native oxide without exposing, to an oxidizing atmosphere, the surface of said conductive material layer exposed at the bottom portion of said contact hole.

9. A method of fabricating a semiconductor device according to claim 8, wherein said substrate temperature is in a range of 300° C. or more.

10. A method of fabricating a semiconductor device according to claim 8, wherein said conductive material layer is an impurity diffusion layer formed on a semiconducting substrate.

11. A method of fabricating a semiconductor device according to claim 10, wherein the depth of said impurity diffusion layer is in a range of 150 nm or less.

12. A method of fabricating a semiconductor device according to claim 8, wherein said conductive material layer is a metal silicide layer formed on the surface of an impurity diffusion layer formed on a semiconducting substrate.

13. A method of fabricating a semiconductor device according to claim 12, said metal silicide layer is made from CoSix.

14. A method of fabricating a semiconductor device according to claim 11, wherein the depth of said impurity diffusion layer is in a range of 150 nm or less.

* * * * *